United States Patent
Sozansky et al.

[11] Patent Number: 5,953,814
[45] Date of Patent: Sep. 21, 1999

[54] PROCESS FOR PRODUCING FLIP CHIP CIRCUIT BOARD ASSEMBLY EXHIBITING ENHANCED RELIABILITY

[75] Inventors: Wayne Anthony Sozansky, Greentown; Michael D. Gibson, Kokomo; Susan Acheson Mack, Kokomo; Michael Patrick Meehan, Kokomo; Darrel Eugene Peugh, Kokomo; James M. Rosson, Kokomo; Robin L. Sellers, Noblesville; Michael Ray Witty, Yorktown, all of Ind.

[73] Assignee: Delco Electronics Corp., Kokomo, Ind.

[21] Appl. No.: 09/032,148

[22] Filed: Feb. 27, 1998

[51] Int. Cl.$^6$ ...................................................... H05K 3/34
[52] U.S. Cl. ........................ 29/840; 29/841; 228/180.22; 438/108
[58] Field of Search ..................... 29/840, 841; 438/108; 228/180.22

[56] References Cited

U.S. PATENT DOCUMENTS

| | | | |
|---|---|---|---|
| 4,604,644 | 8/1986 | Beckham et al. | 29/840 X |
| 5,084,961 | 2/1992 | Yoshikawa | 29/840 |
| 5,089,440 | 2/1992 | Christie et al. | 29/841 |
| 5,121,190 | 6/1992 | Hsiao et al. | . |
| 5,194,930 | 3/1993 | Papathomas et al. | 257/773 |
| 5,274,913 | 1/1994 | Grebe et al. | 29/840 |
| 5,400,950 | 3/1995 | Myers et al. | 228/180.22 |
| 5,542,601 | 8/1996 | Fallon et al. | 228/119 |
| 5,578,525 | 11/1996 | Mizukoshi | 29/840 |
| 5,615,477 | 4/1997 | Sweitzer | 29/840 |
| 5,704,116 | 1/1998 | Gamota et al. | . |
| 5,710,071 | 1/1998 | Beddingfield et al. | 438/108 |

OTHER PUBLICATIONS

Research Disclosure, Jul. 1993 #35133 UV Light Erasable Flip Chip Packaging Technique.

D.R. Gamota et al., Advanced Encapsulant Materials Systems for Flip–Chip–on–Board Assemblies: I. Encapsulant Materials with Improved Manufacturing Properties II. Materials to Integrate the Reflow and Underfilling Process, IEEE/CPMT Int'l Electronics Manufacturing Technology Symposium (1996), pp. 1–9.

*Primary Examiner*—Carl J. Arbes
*Attorney, Agent, or Firm*—Jimmy L. Funke

[57] ABSTRACT

A process and combination of materials for underfilling a surface-mount IC device (12), such as a flip chip, for the purpose of increasing the thermal cycle fatigue life of the terminals (14) that attach the device (12) to a thin-laminate organic circuit board (10), such as a printed wiring board (PWB) or printed circuit board (PCB). The process parameters and materials, including the underfill (20), masking (22) and cleaning materials used, exhibit a synergistic effect that increases thermal cycle fatigue resistance to a level at which a flip chip processed in accordance with this invention is capable of reliably withstanding at least 1000 one-hour cycles between −40° C. and 150° C. The materials and the manner in which the device (12) and circuit board (10) are prepared for application of the materials are critical to eliminating tendencies for inconsistent reliability in underfilled SM devices.

14 Claims, 3 Drawing Sheets

PROCESS FOR PRODUCING FLIP CHIP CIRCUIT BOARD ASSEMBLY EXHIBITING ENHANCED RELIABILITY

FIELD OF THE INVENTION

The present invention generally relates to surface-mount integrated circuit devices. More particularly, this invention relates to a process for attaching a surface-mount integrated circuit device, such as a flip chip, to a laminate circuit board, and entails the use of an underfill material and processing steps that achieve a solder joint fatigue life of at least 1000 cycles when thermal cycled between −40° C. and +150° C.

BACKGROUND OF THE INVENTION

Electronic circuit assemblies are often required to be capable of surviving in hostile operating environments, including those commonly found in automotive and aerospace applications. Such assemblies often employ surface-mount (SM) integrated circuit (IC) devices, which are generally characterized as being electrically and mechanically attached to the substrate of an electronic circuit assembly with a number of terminals or leads that are soldered, such as with a tin-lead solder, to conductors on the surface of the substrate. A prominent example of a SM IC is a flip chip, which has bead-like terminals typically in the form of solder bumps near an edge of the chip. After registering a flip chip to its corresponding conductor pattern on a substrate, heating above the liquidus temperature of the solder produces solder joints that serve to both secure the chip to the substrate and electrically interconnect the flip chip circuitry to the conductor pattern. Due to the numerous functions typically performed by the microcircuitry of a flip chip, a relatively large number of solder bumps are required. The size of a typical flip chip is generally on the order of a few millimeters per side, resulting in the solder bumps being crowded along the edge of the chip. As a result, flip chip conductor patterns are typically composed of numerous individual conductors that are spaced apart about 0.5 millimeter or less.

The solder joints joining a flip chip to a conductor pattern are subject to thermal stresses as a result of temperature fluctuations in the working environment of the assembly and differences in coefficients of thermal expansion (CTE) of the various materials used in the construction of the assembly. A CTE mismatch particularly exists for flip-chip-on-board (FCOB) processes in which a flip chip is mounted to an organic laminate circuit board whose multilayer laminate construction and composition yield CTEs significantly higher than the materials (e.g., silicon, quartz, etc.) from which flip chips are formed. These thermal stresses can potentially fatigue and fracture the solder joints, particularly if the flip chip is subject to many temperature excursions, high temperatures (e.g., 125° C. or more), and/or intense vibration. Under such conditions, the expected life of the solder joints can dramatically decrease, particularly if the flip chip is relatively large (e.g., one-half inch per side). Notably, current integrated circuit packaging trends are toward IC devices with lower standoffs for the purpose of reducing the profile and overall size of the circuit board assembly, with the result being shorter and therefore less compliant leads.

In the prior art, various approaches have been used to reduce thermally-induced solder joint stresses. Understandably, attempts have been made to reduce the temperature extremes to which the assembly is exposed, increase the strength of the solder used to form the solder joints, incorporate additional packaging, and use circuit boards with lower CTEs. The latter approach includes forming the circuit board from such well known materials as alumina, aluminum nitride, silicon, silica, beryllium oxide and barium titanate. However, these solutions have processing and cost disadvantages, and additionally can be incompatible with some applications.

To reduce the effect of the stresses on SM IC solder joints on laminate organic substrates, such as printed circuit boards (PCB) and printed wiring boards (PWB), the prior art has employed various materials for underfilling these devices and encapsulating their solder joints in order to reduce and distribute solder joint stresses. For example, epoxy resins containing a glass filler have been used as underfill materials for SM IC devices, including flip chips. The glass filler reduces the CTE of the underfill material in order to mitigate the thermal mismatch between the flip chip and circuit board. While the use of underfill materials has been shown to sufficiently improve solder joint fatigue life to survive thermal cycling between −40° C. and 125° C. in accordance with standardized test methods, such improvements have not yielded flip chip solder joints that can survive extended thermal cycling between −40° C. and +150° C., as required for more demanding automotive and aerospace applications.

Accordingly, what is needed is a method for improving the solder joint fatigue life of flip chips and potentially other SM ICs beyond that possible with the present art. More particularly, it would be desirable if a flip chip mounted to an organic laminate circuit board could be produced that exhibits significant resistance to thermal cycle fatigue when subjected to thermal cycling between −40° C. and +150° C., and is therefore suitable for demanding automotive and aerospace applications.

SUMMARY OF THE INVENTION

According to the present invention, a process and combination of materials are provided for underfilling a surface-mount IC device, such as a flip chip, for the purpose of increasing the thermal cycle fatigue life of the terminals that attach the device to a thin-laminate organic circuit board, such as a printed wiring board (PWB) or printed circuit board (PCB). The process parameters and materials, including the underfill, masking and cleaning materials used, have been shown to have a synergistic effect that has unexpectedly increased thermal cycle fatigue resistance to a level at which a flip chip processed in accordance with this invention is capable of reliably withstanding at least 1000 one-hour cycles between −40° C. and +150° C., a capability not previously achievable with flip chips processed in a conventional manner. More particularly, the present invention appears to achieve a compromise between two primary failure modes of underfilled SM IC devices—adhesion failure due to stress exceeding the adhesive strength of the underfill material, and fatigue cracking due to solder joint strain. According to this invention, the materials and the manner in which the device and circuit board are prepared for application of the materials are critical to eliminating tendencies for inconsistent reliability in underfilled SM devices.

The process of this invention generally entails a surface mount integrated circuit device, such as a flip chip, having solder bumps on its surface, e.g., near its peripheral edges. The device is to be attached to runners of an appropriate conductor pattern on a circuit board. The circuit board is an organic laminate preferably formed of a fiberglass-filled epoxy resin. The circuit board must have a CTE of less than 20 ppm/° C. in the lateral directions, i.e., in the plane defined by the surface of the circuit board. Multilayer circuit boards having thicknesses of between 0.031 and 0.062 inch (about 0.78 and about 1.6 millimeters) have been shown to be compatible for use with this invention.

A solder mask having a thickness of not greater than about 0.0007 inch (about 18 μm) is then formed on the circuit board, with one or more openings present in the solder mask to expose a portion of each runner, thereby defining solderable pads. The solder mask must have certain adhesion strength properties that are compatible with the circuit board and underfill materials required by this invention. After applying an organic solder preservative or non-oxidizing layer to promote the solderability of the solderable pads, a mildly-active rosin flux is applied to either the solderable pads of the circuit board or the solder bumps of the integrated circuit device, and the device is registered with the conductor pattern on the circuit board. The device is attached to the circuit board by heating the flux and solder bumps to activate the flux and reflow the solder bumps to form solder joints that space the device above the surface of the circuit board about 0.001 to about 0.004 inch (about 25 to 100 micrometers). All residue on the surfaces of the device, solder mask and substrate that will contact the underfill material are then removed by cleaning with a nonaqueous hydrofluorocarbon or hydrochlorofluorocarbon-base solvent that does not absorb into or otherwise affect the cleaned surfaces.

Underfilling of the device is then performed by heating and maintaining the assembly at a temperature sufficient to eliminate moisture from the assembly and, within thirty minutes, applying an underfill material along at least one edge of the integrated circuit device. The assembly is maintained at an adequate temperature to enable the underfill material to flow beneath the device so as to completely fill the void between the device and the circuit board. According to the invention, the underfill material is an anhydride-cure bisphenol A-modified cycloaliphatic epoxy resin system filled with about 50 to about 75 weight percent glass spheres and contains flow and adhesion promoters. Critical properties for the cured underfill material include a glass transition temperature (Tg) onset of at least 150° C. and a bending modulus approximately equal to that of the circuit board laminate material (e.g., about 5 to 15 GPa). The cured underfill material must also be characterized by an adhesion strength to the device of at least 7500 psi shear (about 52 MPa), an adhesion strength to the solder mask and circuit board of at least 750 psi shear (about 5.2 MPa), an adhesion strength to the circuit board that is greater than its adhesion strength to the solder mask and greater than the adhesion strength of the solder mask to the circuit board, and a CTE of less than 25 ppm/° C.

After completely underfilling the integrated circuit device, an additional amount of the underfill material is applied along the remaining edges of the integrated circuit device so as to form a uniform fillet that extends beyond the edge of the device and at least one-half the distance up the side of the device. This aspect of the invention has been determined to be a critical step in attaining the desired thermal cycle fatigue resistance for the solder joints. As another critical aspect of this invention, the assembly must then be appropriately cured within one hour of applying the underfill material.

According to this invention, materials having the physical and mechanical properties noted above in combination with the prescribed processing steps have been shown to produce electronic assemblies that exhibit less than a 10% increase in solder joint electrical resistance when subjected to at least 1000 one-hour thermal cycles between temperature extremes of −40° C. and +150° C. Such resistance to thermal cycle fatigue has not been previously achieved with surface-mount devices, which conventionally have exhibited acceptable thermal fatigue resistance if limited to a maximum test temperature of only 125° C. The dramatic increase in thermal cycle fatigue resistance achieved by this invention has not been fully explained, but appears to be a synergistic effect arising from the interaction of the various materials, material properties, and process steps employed by the invention.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
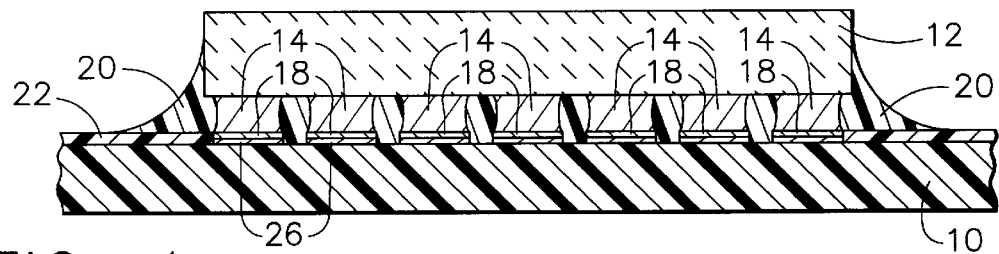
FIG. 1 is a cross-sectional view of a printed circuit board having a flip chip mounted thereon, in which an underfill material has been applied to the assembly to underfill the flip chip and encapsulate solder joints at the perimeter of the chip in accordance with this invention.

FIG. 1 represents a typical application for the process of this invention, and serves to illustrate some of the general concepts of this invention. Shown in FIG. 1 is a circuit board 10 on which is mounted a flip chip 12. The circuit board 10 is a thin-laminate organic substrate, such as a printed circuit board (PCB) or a printed wiring board (PWB). As is conventional, the chip 12 is electrically and physically connected with a number of solder joints 14 to solderable pads 26 defined on conductor runners 16 on the surface of the circuit board 10. The solder joints 14, which are typically formed by reflowing solder bumps originally formed on the chip 12, support the chip 12 above the surface of the circuit board 10 as shown. The solder is typically a eutectic or near-eutectic tin-lead solder, though various solder compositions could be used, including indium-lead solders.

The above-described application is merely intended to generally represent one of various circuit assemblies to which this invention applies. Therefore, the teachings of this invention are not limited to the specific configuration shown in FIG. 1, and can be applicable to electronic assemblies that utilize essentially any type and combination of surface mount technology (SMT) IC packages and various terminal designs.

Because of the differences in materials used to form the circuit board 10, chip 12 and solder joints 14, a mismatch in coefficients of thermal expansion exists. Without underfilling, this mismatch generates stresses during temperature excursions that are concentrated in the solder joints 14. To mitigate the adverse effect of such stresses, an underfill material 20 is shown as covering the solder joints 14 and completely filling the void between the circuit board 10 and chip 12. Tests and modeling of flip chips mounted to laminate printed circuit boards have indicated that two primary failure modes exist with underfilled SM IC devices—adhesion failure due to stress exceeding the adhesive strength of the underfill material, and fatigue cracking due to solder joint strain. As a result, in order to maximize thermal fatigue life, an optimal compromise must be achieved between these two competing failure mechanisms.

Figure 2:
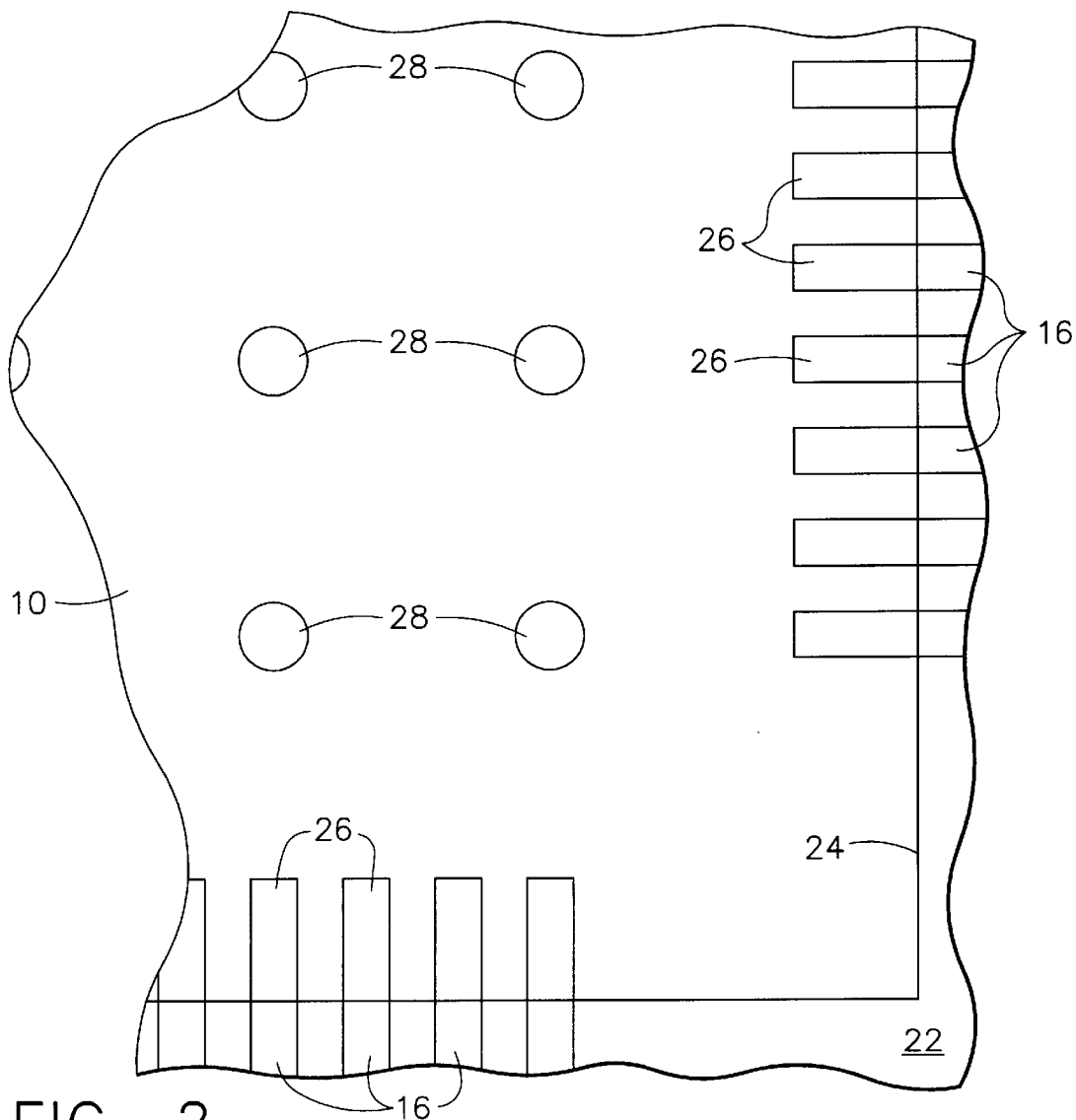
FIG. 2 is a plan view of a corner of the printed circuit board of FIG. 1.

An investigation of numerous possible material combinations using prior art processes was undertaken, but yielded underfilled SM devices that exhibited inconsistent reliability as quantified by change in solder joint electrical resistance, with a 10% increase serving as a threshold level when thermal cycled between −40° C. and +150° C. in accordance with the temperature profile shown in FIG. 2. For example, certain cleaning solutions were unexpectedly determined to be detrimental to circuit board materials that otherwise exhibited excellent mechanical and physical properties. By altering the processes and employing combinations of certain materials, the present invention has eliminated certain unexpected incompatibilities and appears to profit synergistically from other interactions to yield flip chips that are able to survive 1000 one-hour thermal cycles between −40° C. and +150° C., and have a mean time to failure (MTTF) of 1500 under these test conditions. Accordingly, the materials and the manner in which the flip chip and circuit board are processed in accordance with this invention have been determined to be critical to eliminating inconsistent reliability in underfilled SM devices mounted to laminate organic circuit boards.

The process of this invention entails a flip chip 12 such as that shown in FIG. 1, with solder bumps on one surface typically near an edge of the chip 12. Flip chips as large as 0.5 inch (about 13 millimeters) per side can be used. Preferred solders include eutectic 63Sn-37Pb solders and 50In-50Pb solders, though other solder compositions are potentially within the scope of this invention. Solder bump pitches of as little as about 0.008 inch (about 0.2 millimeters) have been shown to be compatible with the processes and materials of this invention, though larger and smaller pitches are within the scope of this invention.

According to the invention, circuit board materials that are compatible with this invention are thin laminates formed of a fiberglass-filled epoxy resin, preferred examples of which are a fiberglass-filled filled (30–40 weight percent) brominated epoxy resin laminate available from QLP Laminates, Inc., under the trademark ULTRA-PLUS 2000, and a fiberglass-filled (40–70 weight percent) epoxy resin laminate available from Allied Signal Laminate Systems, Inc., under the trademark FR406. These laminates were determined to be compatible with the preferred solder mask materials when processed in accordance with this invention, as discussed below. Notably, unacceptable and inconsistent results were obtained when the preferred solder mask materials were applied to circuit boards having other compositions, and when applied to the preferred circuit board materials but with other material and process differences than that described below. Also critical to this invention, each of these laminate materials has a CTE of less than 20 ppm/° C. in the lateral directions, i.e., in the plane defined by the surface of the circuit board, and a bending modulus of about 5 to 9 GPa. Finally, the circuit board 10 preferably has a thickness of between 0.031 and 0.062 inch (about 0.78 to about 1.6 millimeters).

A solder mask 22 having a thickness of about 0.0002 to 0.0007 inch (about 5 to about 18 micrometers) is then formed on the circuit board 22, with an opening 24 being formed in the solder mask 22 to expose a portion of each runner 16, thereby defining solderable pads 26. A standoff height of about 0.001 to about 0.004 inch (about 25 to 100 micrometers) between the lower surface of the chip 12 and the circuit board 22 has been determined to be critical to this invention. The size and shape of the solder pads 26 strongly influence the standoff height of the chip 12, and are therefore also critical to the invention. To achieve the required standoff height, the solder pads 26 preferably have widths of about 0.003 to about 0.006 inch (about 75 to 150 micrometers), lengths of at least twice the width, and thicknesses of about 0.0005 to about 0.002 inch (about 12 to 50 micrometers), as generally depicted in FIG. 2. Also according to this invention, the solder mask material must be an aqueous developing and photoimageable material, preferably an epoxy acrylate ester resin composition, examples of which are HYSOL SR8200R available from the Dexter Electronic Materials Division, and PROBIMER 74S10 available from Ciba-Geigy, Inc. Solder masks 22 formed by each of these materials have been determined to exhibit the adhesion strength determined by this invention to be required for use with the materials specified for the circuit board 10 and underfill 20, as discussed in greater detail below. The solderable pads 26 are then made solderable by treatment with an organic solder preservative (OSP) such as triazol or an imidizol, or covered with a non-oxidizing layer 18 such as Ni—Au, Ag, Sn—Pb, or Sn.

A mildly-activated rosin flux, classified under J-STD-004 as ROL0, is then either screen printed on the solderable pads 26 or applied to the solder bumps by dipping. According to this invention, a flux preferred for its ability to achieve excellent solderability while leaving no surface contamination is SP244C (also identified as "TSF6521C") available from Litton Kester Solder of Des Plaines, Ill. About 0.5 to about 3.5 micrograms of flux is preferably present at each bump site by the above application techniques. The solder bumps are then registered with the pads 26, and the chip 12 is physically and electrically attached to the circuit board 10 by heating to activate the flux and reflow the solder bumps, forming the solder joints 14 shown in FIG. 1. As stated above, it is critical that the chip 12 is spaced above the surface of the circuit board 10 about 0.001 to about 0.004 inch after reflow. A preferred method for promoting control of the chip-board standoff height is to employ "dummy" solder bumps on the flip chip 12 that register with "dummy" bond pads 28 on the circuit board 10, as disclosed in U.S. Pat. No. 5,400,950, which is incorporated herein by reference.

All residue on the surfaces of the chip 12, solder mask 22 and circuit board 10 that will contact the underfill material 20 must then be removed by cleaning with a nonaqueous solvent. According to this invention, it is important to avoid absorption of the solvent by the materials specified for the solder mask 22 and circuit board 10. A preferred solvent is VERTREL XMS, commercially available from E.I. DuPont de Nemours and Company, Inc., and having a hydrofluorocarbon-base formulation that contains, by weight, about 53.0 to about 60.0 percent 1,1,1,2,3,4,4,5,5,5-decafluoropentane, about 18.0 to about 26.0 trans 1,2-dichloroethylene, about 4.0 to about 8.0 percent methanol, about 14 to about 20 percent cyclopentane, and up to about 5 percent 2,2-dimethylbutane. An alternative solvent is AK225-ATMS, commercially available from Asahi Glass Co., Ltd., and having a hydrochlorofluorocarbon-base formulation containing 3,3-dichloro-1,1,1,2,2-pentafluoropropane and 1,2-dichloro-1,1,2,2,3-pentafluoropropane, trans 1,2-dichloroethylene, methanol and nitromethane.

The cleaned assembly is then heated and maintained at a temperature of at least 150° C. for a duration of at least about 15 minutes to evaporate any moisture remaining on the assembly. The chip 12 is then underfilled within thirty minutes after the foregoing step, or otherwise within thirty minutes of a subsequent heating cycle with similar parameters. The underfill material 20 is applied along one or more edges of the chip 12, and then the assembly maintained at an adequate temperature, preferably about 80° C., to enable the underfill material 20 to flow beneath the chip 12 and toward the opposite edge of the chip 12, so as to completely fill the void between the chip 12 and circuit board 10. An additional amount of underfill material 20 is then applied along the remaining edges of the chip 12 to form a fillet as shown in FIG. 1. Importantly, a sufficient amount of underfill material 20 is deposited such that the fillet extends about 0.020 inch to about 0.070 inch (about 0.5 to about 1.75 millimeters) beyond the edge of the chip 12, and extends at least one-half the distance up the sides of the chip 12. According to the invention, the fillet must be uniform, defined herein as less than 50% variation in width around the chip 12. Unexpectedly, the presence of a uniform fillet has been determined to be a critical factor in attaining the thermal cycle fatigue resistance for the solder joints 14. Another critical aspect of this invention is that the underfill material 20 must be cured within one hour of its application. Curing is performed in air or a nitrogen atmosphere at a temperature of at least 145° C. for a duration of at least ninety minutes. Heating rates of about 0.1 to about 10° C./minute are acceptable.

According to the invention, the cured underfill material 20 must be characterized by an adhesion strength to the chip 12 of at least 7500 psi shear (about 52 MPa), an adhesion strength to the solder mask 22 and circuit board 10 of at least 750 psi shear (about 5.2 MPa), an adhesion strength to the circuit board 10 that is greater than the adhesion strength of the cured underfill material 20 to the solder mask 22 and greater than the adhesion strength of the solder mask 22 to the circuit board 10, a CTE of less than 25 ppm/° C., and a glass transition temperature ($T_g$) onset of at least 150° C. Underfill material that meet these requirements and have been found to be compatible with the other materials and the processes employed by this invention are anhydride cure resin systems filled with about 50 to about 75 percent glass spheres. To be effective, the glass filler must remain uniformly dispersed in the resin system, not settling more than 20% following cure. Preferred underfill materials are HYSOL FP4511 available from the Dexter Electronics Materials Division, and U8431L available from Namics Corporation. HYSOL FP4511 is an anhydride-cure bisphenol A-modified cycloaliphatic epoxy resin system containing, in weight percent, about 5–10% cycloaliphatic epoxy resin, about 11–35% substituted phthalic anhydride, about 1–5% bisphenol A epoxy resin, and the balance silicon dioxide as a filler. U8431L is also an anhydride-cure bisphenol A-modified cycloaliphatic epoxy resin system containing, in weight percent, about 5–15% bisphenol A epoxy resin, about 5–15% alicyclic epoxy resin, about 10–20% organic acid anhydride compound, about 60–70% silicon dioxide, and greater than 1% carbon black. At the preferred underfill temperature of about 70° C. to 90° C., these materials have a viscosity of about 1000 centipoise or less, and when cured have the following properties: a glass transition temperature ($T_g$) onset of at least 150° C., bending modulus of about 9 GPa, an adhesion strength to the flip chip 12 of at least 7500 psi shear (about 52 MPa), an adhesion strength to the solder mask 22 and circuit board 10 of at least 750 psi shear (about 5.2 MPa), and a CTE of about 20 ppm/° C.

Figure 3:
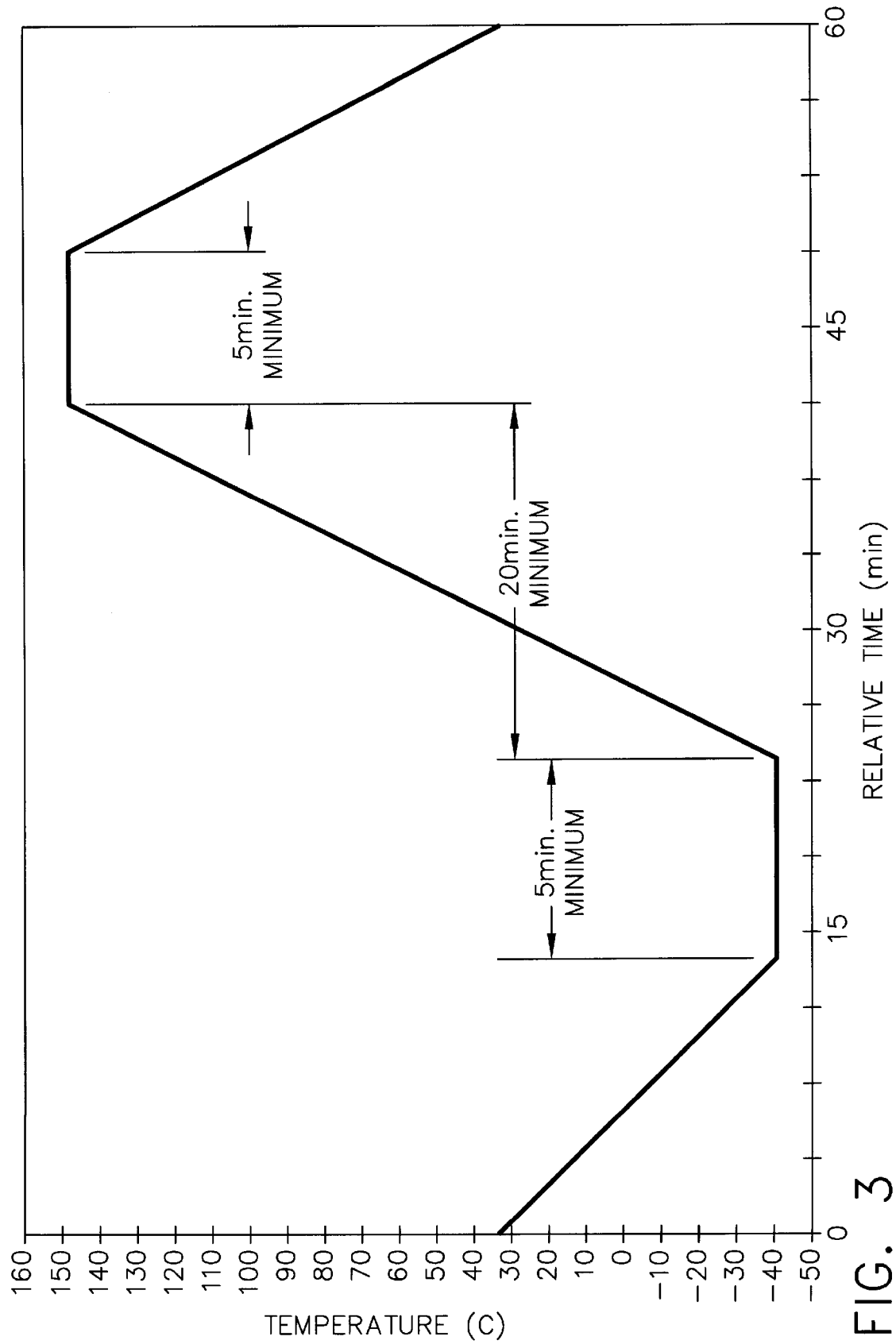
FIG. 3 depicts a one-hour thermal cycle employed in the evaluation of this invention.
Figure 4:
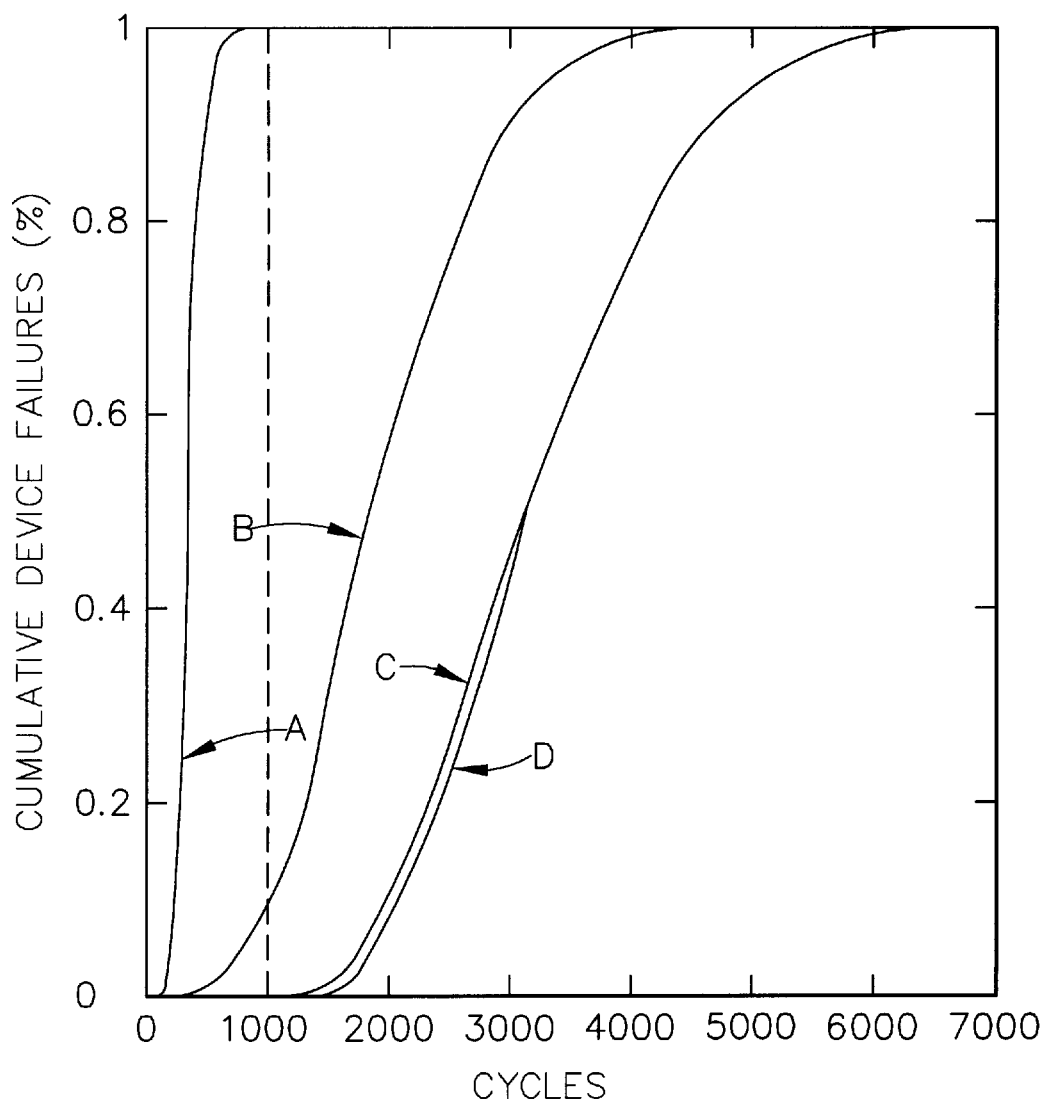
FIG. 4 is a graph representative of thermal cycle fatigue data for flip chip assemblies processed in accordance with this invention and the prior art.

During the investigations that led to this invention, numerous combinations of processing steps, materials, conductor patterns and flip chips were evaluated to determine the thermal cycle fatigue resistance of the resulting solder joints when repeatedly subjected to the thermal cycle shown in FIG. 3. The investigation evaluated four different circuit board compositions, seven solder mask materials, fifteen flux compositions, five cleaning solvents and sixty underfill materials, in addition to differing conductor configurations, solder materials, and processing steps, temperatures and durations. During the evaluation, it became evident that certain combinations would fail prematurely by a variety of mechanisms, while others would perform better yet below the 1000-cycle target established as a minimum thermal cycle fatigue life for the evaluation. Unexpectedly, the combination of materials and processing parameters of this invention was shown to yield solder joints whose thermal cycle fatigue resistance markedly exceeded that of other combinations, as shown in FIG. 4, which compares the present invention to prior art FCOB processes with three-parameter (3P) Weibull functions. Curves "C" and "D" represent thermal cycle fatigue data obtained with flip chips attached to circuit boards in accordance with this invention. These assemblies consistently exhibited no failures after 1000 one-hour cycles between −40° C. and +150° C., and a cumulative failure rate of less than 0.1% after 2000 cycles. The components of the assemblies represented by curves "C" and "D" were as follows.

|  | "C" | "D" |
| --- | --- | --- |
| Circuit Board | FR406 | FR406 |
| Solder Mask | PROBIMER 74S10 | HYSOL SR8200R |
| Flux | Kester SP244C | Kester SP244C |
| Solvent | VERTREL XMS | Asahi AK225-ATMS |
| Underfill | Namics U8431L | Namics U8431L |

In contrast, initial attempts directed to the use of no-clean fluxes produced the data of curve "A", which evidences an unacceptable cumulative failure rate of over 1% after 1000 cycles. The same processing, circuit board laminate and solder mask material were used to produce the data of Curves "A" and "D", with the difference being that the assembly of Curve "A" employed a liquid flux, a different epoxy underfill material, and was processed without cleaning prior to underfill. Finally, Curve "B" evidences test results obtained with flip chips processed with the same flux as that used to produce Curves "C" and "D", but with trichloro-ethylene (TCE) as the cleaning solvent, a different epoxy underfill material, and a different solder mask composition. The failure mode of the assemblies producing the data of Curve "A" was adhesion loss at the underfill-circuit board interface. Similarly, the failure mode of the assemblies producing the data of Curve "B" was adhesion loss at the underfill-die interface. In contrast, the failure mode for the assemblies producing the data of Curves "C" and "D" was solder fatigue, which is believed to be the result of the relative adhesion strengths between the underfill, chip, solder mask and circuit board specified by this invention.

According to the above, to achieve the desired thermal cycle fatigue resistance for a surface-mount integrated circuit device to a laminate circuit board, the present invention has quantified the required adhesion strengths between the underfill, chip, solder mask and circuit board. It is believed that the relative adhesion strengths established and required by this invention achieve a compromise between the two primary failure modes of underfilled SM IC devices— adhesion failure of the underfill material and solder joint fatigue cracking—so that the occurrence of adhesion failure is drastically reduced and reliability is shifted to solder joint fatigue resistance. The material combination and processes described above have been determined to achieve the required adhesion strengths and thermal cycle fatigue resistance, though the manner in which these materials achieve the desired results are not understood. Therefore, while the invention has been described in terms of a preferred embodiment, it is apparent that other forms could be adopted by one skilled in the art. Accordingly, the scope of the invention is to be limited only by the following claims.

What is claimed is:

1. A method for attaching an integrated circuit device to an electronic circuit assembly, the method comprising the steps of:

producing an integrated circuit device to have a plurality of terminals on a surface of the integrated circuit device near edges thereof, the edges being formed by the surface and sidewalls of the integrated circuit device;

producing a circuit board to have conductor runners on a surface thereof, the circuit board having a CTE of less than 20 ppm/° C. in a plane defined by the surface of the circuit board, the circuit board being a fiberglass-filled epoxy resin laminate having a predetermined bending modulus;

applying a solder mask material to the circuit board, the solder mask material forming a solder mask on the circuit board that exposes at least a portion of each conductor runner and thereby defines a solderable pad on each of the runners;

registering the integrated circuit device with the circuit board so that a mildly-activated rosin flux is present between the solderable pads of the circuit board and the terminals of the integrated circuit device;

attaching the integrated circuit device to the circuit board to form an assembly by heating the flux and terminals to activate the flux and reflow the terminals, the terminals forming solder joints between the integrated circuit device and the runners, the integrated circuit device being spaced from the circuit board about 0.001 to about 0.004 inch so as to define a void therebetween;

removing any residue of the flux with a nonaqueous hydrofluorocarbon or hydrochlorofluorocarbon-base base solvent;

heating and maintaining the assembly at a temperature sufficient to eliminate moisture from the assembly;

within about thirty minutes of completion of the heating step, applying an underfill material along at least one of the edges of the integrated circuit device, the underfill material flowing beneath the integrated circuit device so as to completely fill the void between the integrated circuit device and the circuit board, the underfill material comprising an anhydride-cure bisphenol A-modified cycloaliphatic epoxy resin system filled with about 50 to about 75 weight percent glass spheres;

after filling the void between the integrated circuit device and the circuit board, applying an additional amount of the underfill material along remaining edges of the integrated circuit device so as to form a uniform fillet that extends at least about 0.020 inch beyond the edges of the integrated circuit device and covers at least a lower half of each sidewall of the integrated circuit device; and within one hour of applying the underfill material, curing the underfill material at a temperature of at least 145° C. for at least ninety minutes, the cured underfill material being characterized by a glass transition temperature onset of at least 150° C., a bending modulus approximately equal to the bending modulus of the circuit board, an adhesion strength to the integrated circuit device of at least 7500 psi shear, an adhesion strength to the solder mask and circuit board of at least 750 psi shear, an adhesion strength to the circuit board that is greater than an adhesion strength of the cured underfill material to the solder mask and greater than an adhesion strength of the solder mask to the circuit board, and a CTE of less than 25 ppm/° C.;

wherein the assembly exhibits less than a 10% increase in solder joint electrical resistance when subjected to at least 1000 one-hour thermal cycles between temperature extremes of −40° C. and +150° C.

2. A method as recited in claim 1, wherein the underfill material consists essentially of, in weight percent, about 5–10% cycloaliphatic epoxy resin, about 11–35% substituted phthalic anhydride, about 1–5% bisphenol A epoxy resin, and the balance silicon dioxide.

3. A method as recited in claim 1, wherein the underfill material consists essentially of, in weight percent, about 5–15% bisphenol A epoxy resin, about 5–15% alicyclic epoxy resin, about 10–20% organic acid anhydride compound, about 60–70% silicon dioxide, and greater than 1% carbon black.

4. A method as recited in claim 1, wherein the organic laminate of the circuit board consists essentially of brominated epoxy resin laminate containing about 30 to about 40 weight percent fiberglass.

5. A method as recited in claim 1, wherein the organic laminate of the circuit board contains about 40–70 weight percent fiberglass.

6. A method as recited in claim 1, wherein the solder mask material comprises an epoxy acrylate ester resin composition.

7. A method as recited in claim 1, further comprising a nickel-gold plating on the solderable pads.

8. A method as recited in claim 1, further comprising an organic solder preservative on the solderable pads.

9. A method as recited in claim 1, wherein the solder bumps are formed of a eutectic or near-eutectic tin-lead solder.

10. A method as recited in claim 1, wherein each of the solderable pads having a width of about 0.003 to about 0.006 inch, a length of at least twice the width of the solderable pad, and a thickness of about 0.0005 to about 0.002 inch.

11. A method for attaching a flip chip to an electronic circuit assembly, the method comprising the steps of:

producing a flip chip to have a plurality of solder bumps on a surface of the flip chip near edges thereof, the edges being formed by the surface and sidewalls of the flip chip;

producing a circuit board have conductor runners on a surface thereof, the circuit board being formed of a brominated epoxy resin laminate containing about 30 to about 40 weight percent fiberglass, the circuit board having a thickness of about 0.031 to about 0.062 inch and having a CTE of less than 20 ppm/° C. in a plane defined by the surface of the circuit board;

applying a solder mask material to the circuit board, the solder mask material comprising an epoxy acrylate ester resin composition, the solder mask material forming a solder mask on the circuit board that exposes at least a portion of each conductor runner and thereby defines a solderable pad on each of the runners, each of the solderable pads having a width of about 0.003 to about 0.006 inch, a length of at least twice the width of the solderable region, and a thickness of about 0.0005 to about 0.002 inch;

registering the flip chip with the circuit board so that a mildly-activated rosin flux is present between the solderable pads of the circuit board and the solder bumps of the flip chip;

attaching the flip chip to the circuit board to form an assembly by heating the flux and solder bumps to activate the flux and reflow the solder bumps, the solder bumps forming solder joints between the flip chip and the solderable pads, the flip chip being spaced from the circuit board about 0.001 to about 0.004 inch so as to define a void therebetween;

removing any residue of the flux with a solvent consisting essentially of, by weight, about 53.0 to about 60.0 percent 1,1,1,2,3,4,4,5,5,5-decafluoropentane, about 18.0 to about 26.0 trans 1,2-dichloroethylene, about 4.0 to about 8.0 percent methanol, about 14 to about 20 percent cyclopentane, and up to about 5 percent 2,2-dimethylbutane;

heating and maintaining the assembly at a temperature of at least 150° C. for a duration of at least about 15 minutes to eliminate moisture from the assembly;

within about thirty minutes of completion of the heating step, applying an underfill material along at least one of the edges of the flip chip, the underfill material flowing beneath the flip chip so as to completely fill the void between the flip chip and the circuit board, the underfill material being an anhydride cure epoxy resin system consisting essentially of, in weight percent, about 5–15% bisphenol A epoxy resin, about 5–15% alicyclic epoxy resin, about 10–20% organic acid anhydride compound, about 60–70% silicon dioxide, and greater than 1% carbon black;

after filling the void between the flip chip and the circuit board, applying an additional amount of the underfill material along remaining edges of the flip chip so as to form a uniform fillet that extends about 0.020 inch to about 0.070 inch beyond the edges of the flip chip and covers at least a lower half of each sidewall of the flip chip; and within one hour of applying the underfill material, curing the underfill material at a temperature of at least 145° C. for at least ninety minutes, the cured underfill material being characterized by an adhesion strength to the flip chip of at least 7500 psi shear, an adhesion strength to the solder mask and circuit board of at least 750 psi shear, an adhesion strength to the circuit board that is greater than an adhesion strength of the cured underfill material to the solder mask and greater than an adhesion strength of the solder mask to the circuit board, a CTE of less than 25 ppm/° C., and a glass transition temperature onset of at least 150° C.;

wherein the assembly exhibits less than a 10% increase in solder joint electrical resistance when subjected to at least 1000 one-hour thermal cycles between temperature extremes of −40° C. and +150° C.

12. A method as recited in claim 11, further comprising a nickel-gold plating on the solderable pads.

13. A method as recited in claim 11, further comprising an organic solder preservative on the solderable pads.

14. A method as recited in claim 11, wherein the solder bumps are formed of a eutectic or near-eutectic tin-lead solder.

* * * * *